(12) United States Patent
Gallia

(10) Patent No.: US 6,708,303 B1
(45) Date of Patent: Mar. 16, 2004

(54) METHOD AND APPARATUS FOR CONTROLLING A SEPERATE SCAN OUTPUT OF A SCAN CIRCUIT

(75) Inventor: James D. Gallia, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/259,004

(22) Filed: Feb. 26, 1999

Related U.S. Application Data

(60) Provisional application No. 60/077,050, filed on Mar. 6, 1998.

(51) Int. Cl.[7] ............................................. G01R 31/28
(52) U.S. Cl. ................................ 714/726; 326/16
(58) Field of Search ............................... 714/726, 724, 714/727, 729, 730, 24–25, 740; 327/202, 185; 326/16

(56) References Cited

U.S. PATENT DOCUMENTS

| | | | | | |
|---|---|---|---|---|---|
| 5,260,948 A | * | 11/1993 | Simpson et al. | ............ | 714/727 |
| 5,329,471 A | * | 7/1994 | Swoboda et al. | ...... | 395/500.44 |
| 5,444,404 A | * | 8/1995 | Ebzery | ...................... | 327/185 |
| 5,535,331 A | * | 7/1996 | Swoboda et al. | ............. | 714/45 |
| 5,701,307 A | * | 12/1997 | Whetsel | ....................... | 714/29 |
| 5,701,308 A | * | 12/1997 | Attaway et al. | ............ | 714/740 |
| 5,774,475 A | * | 6/1998 | Qureshi | ...................... | 714/726 |
| 6,085,336 A | * | 7/2000 | Swoboda et al. | ............. | 714/30 |
| 6,202,185 B1 | * | 3/2001 | Lee | ............................. | 714/726 |

* cited by examiner

*Primary Examiner*—Guy J. Lamarre
(74) *Attorney, Agent, or Firm*—Robert D. Marshall, Jr.; W. James Brady, III; Frederick J. Telecky, Jr.

(57) ABSTRACT

A scan circuit (10) has a scan data input (17), a normal data input (18), a clock input (22), a scan enable input (19), a normal data output (23), and a scan data output (24). The scan circuit includes a multiplexer (27) having two data inputs respectively coupled to the scan data input and normal data input of the scan circuit, having a control input coupled to the scan enable input of the scan circuit, and having an output. The scan circuit also includes a D-type flip-flop (28) having a data input coupled to the output of the multiplexer, having a clock input coupled to the clock input of the scan circuit, and having a data output serving as the normal data output of the scan circuit. The scan circuit further includes a gate (29) having a first input coupled to an output of the flip-flop, having a second input coupled to the scan enable input of the scan circuit, and having an output which serves as the scan data output of the scan circuit.

2 Claims, 1 Drawing Sheet

METHOD AND APPARATUS FOR CONTROLLING A SEPERATE SCAN OUTPUT OF A SCAN CIRCUIT

This application claims priority under 35 USC §119(e)(1) of Provisional Application No. 60/077,050, filed Mar. 6, 1998.

TECHNICAL FIELD OF THE INVENTION

This invention relates in general to a scan circuit and, more particularly, to a method and apparatus for controlling a separate scan output of a scan circuit.

BACKGROUND OF THE INVENTION

When designing digital electronic circuits, an important consideration in many applications is to include provisions for testing and/or debugging the resulting circuit. This is particularly important when the circuit will be fabricated as an integrated circuit, because discrete points or nodes within the circuit are not readily accessible for purposes of test or debug.

One well-established approach is the Williams and Angell technique, and is also known as a serial scan technique. Under the Williams and Angell technique, all storage elements in a circuit, except random access memory (RAM) and read-only memory (ROM), are implemented using scan flip-flops, which each have two data inputs. In particular, each such flip-flop has a normal data input and a scan data input, and also has a mode control input to select between the normal data input and the scan data input. Each flip-flop also has a single clock input, which is used for both modes.

A typical scan flip-flop may be implemented with a D-type flip-flop and a two-to-one multiplexer, the multiplexer having two data inputs which respectively serve as the normal and scan data inputs, having a select input which serves as the mode control input, and having a data output which is coupled to the data input of the D-type flip-flop.

The Williams and Angell technique further provides that all scan flip-flops in the circuit are interconnected so as to form one long serial shift register, in particular by coupling the data or "Q" output of each flip-flop to the scan data input of another flip-flop. The scan data input of the first flip-flop in the chain can receive serial test patterns from a tester, and the data output of the last flip-flop in the chain can be coupled to the tester so that the tester can receive data output from the chain. The chain connections are used only when the circuit is operating in a scan mode, and not when the circuit is operating in a normal mode.

In such a circuit, the scan mode can be used to facilitate testing or debugging in two distinct ways. First, with the circuit in the scan mode, a data pattern can be introduced serially into the chain of flip-flops, so that each flip-flop in the chain is set to a respective predetermined logic state. The circuit can then be switched to the normal mode, so that operation in the normal mode then proceeds from a known initial state of the circuit.

Second, use of the scan mode may be appropriate after the circuit has been operating for a period of time in the normal mode. The circuit can be switched from the normal mode to the scan mode, and then the data present in all of the flip-flops in the circuit can be read out serially from the chain of flip-flops. The resulting data is a snapshot of the current operational state of the entire circuit. If the output of the last flip-flop in the chain is connected to the scan input of the first flip-flop in the chain while this data is being serially extracted, the data will be reintroduced into the chain as it is being serially read out. Thus, after the last bit of information is serially read out, the entire chain will be returned to the precise state which it had when the serial readout began. The circuit can then be shifted from the scan mode back to the normal mode in order to continue normal operation from the point at which it was interrupted.

Alternatively, instead of shifting back into the chain the data which is being serially read out, a different data pattern can be shifted into the chain in order to set each of the flip-flops to a known state. The circuit can then be shifted from the scan mode back to the normal mode, so that it continues normal operation from the known state, rather from the state that it was in when the normal mode was interrupted.

When a circuit using the Williams and Angell technique is implemented, a software program is often used to lay out the locations of the components and the runs or connections between components. The software program normally does this in a manner intended to minimize the lengths of the normal operational connections between components, rather than the lengths of the scan connections. Consequently, the scan connections between successive flip-flops in the chain may be relatively long. The length of each such scan connection represents a capacitance which must be switched between logic states each time there is a change in the logic state of the output of the flip-flop driving that scan connection. This has certain ramifications, particularly where the circuit is implemented in CMOS.

For example, the capacitance of a relatively long scan connection will slow down the speed at which a flip-flop can switch the logical state of the signal on that connection, which represents an undesirable propagation delay for that signal. In addition, switching the state of that scan connection requires the dissipation of power, due to the capacitance. During a normal mode, when the scan connection is being ignored, the additional power required to switch the scan connection represents wasted power. Wasted power is always undesirable, but it is particularly undesirable where the circuit is powered by a battery, for example in a situation where the circuit is part of a portable computer.

A further consideration is that, since the scan connections directly interconnect respective scan flip-flops without any intervening circuitry, there is a risk of a race condition due to skewed clock signals. Such a race condition occurs where a first flip-flop is clocked and the resulting change in its output signal propagates across a scan connection to a second flip-flop before the second flip-flop is clocked.

One known technique for addressing some of these problems involves the provision of a scan flip-flop which has both a normal data output and a separate scan data output. The scan data output of each flip-flop is used to drive the scan connection to the next flip-flop in the chain, whereas the normal data output is used to effect normal operational connections for that flip-flop. Since the normal data output no longer drives the relatively long scan connection, it can switch states more quickly, thus reducing propagation delays. Further, the flip-flop may be intentionally designed with a discrete propagation delay for the scan data output, so that the scan data output switches states slightly later than the normal data output. This avoids a race condition across a scan connection, by ensuring that a change in the state of the signal at the scan data output is delayed somewhat after the clock edge which triggered the change, so that a flip-flop at the remote end of the scan connection will be clocked before the signal supplied across that scan connection can change states.

This known variation of the scan flip-flop reduces or avoids the problem of propagation delay in the operational signal, and the problem of a race condition in the scan connection. These known flip-flops have thus been adequate for their intended purpose. However, they have not been satisfactory in all respects. In particular, the separate scan outputs from these flip-flops still switch states in both the normal mode and the scan mode. Consequently, in the normal mode, the signals on the scan connections are changing states even though they are being ignored, which represents an unnecessary waste of power. With respect to correction of this problem, it is necessary to bear in mind that any circuitry added to reduce power consumption will itself consume power, and thus must reduce power consumption in the rest of the circuit by an amount which is greater than its own power consumption, in order to realize a net reduction in power consumption. Further, the area required on an integrated circuit for this additional circuitry should be minimal.

SUMMARY OF THE INVENTION

From the foregoing, it may be appreciated that a need has arisen for a method and apparatus for controlling a separate scan output of a scan circuit, so as to reduce overall power consumption without significantly increasing the area required to implement the scan circuit in an integrated circuit, and so as to avoid race conditions relative to the separate scan output. According to the present invention, a method and apparatus are provided to address this need, and involve disabling the scan data output of the scan circuit during a normal mode of operation.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
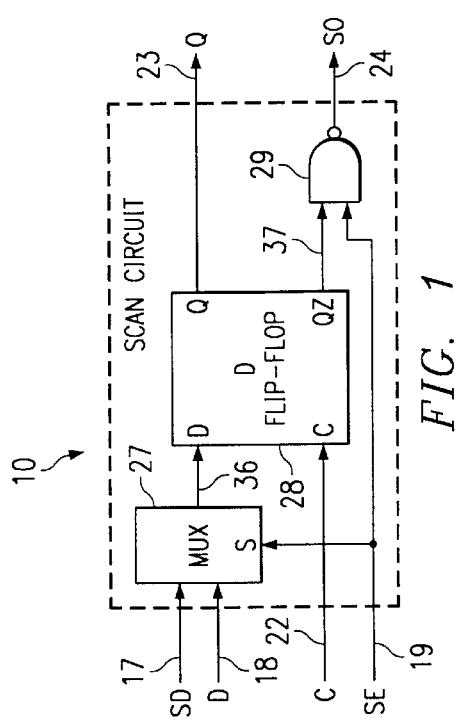
FIG. 1 is a schematic diagram of a scan circuit which embodies the present invention.

FIG. 1 is a schematic diagram of a scan circuit 10 which embodies the present invention. The scan circuit 10 has a scan data input 17, a normal data input 18, a scan enable input 19, and a clock input 22. The scan circuit 10 also has a normal data output 23, and a scan data output 24.

The scan circuit 10 includes a two-to-one multiplexer 27, a D-type flip-flop 28, and a two-input NAND gate 29. The flip-flop 28 is the main operational component of the scan circuit 10. The two data inputs of the multiplexer 27 are respectively coupled to the scan data input 17 and the normal data input 18 of the scan circuit 10, and the select control input S of the multiplexer 27 is coupled to the scan enable input 19 of the scan circuit 10. The multiplexer 27 has an output 36, which is coupled to the data input D of the flip-flop 28. The flip-flop 28 has a clock input C, which is coupled to the clock input 22 of the scan circuit 10.

The flip-flop 28 has a normal data output Q, which serves as the normal data output 23 of the scan circuit 10. The flip-flop 28 also has an inverted data output QZ, which is coupled at 37 to one input of the two-input NAND gate 29, and which carries a signal that is the logical inverse of the signal present at the Q output. The other input of the two-input NAND gate 29 is coupled to the scan enable input 19 of the scan circuit 10. The NAND gate 29 has an output which serves as the scan data output 24 of the scan circuit 10.

The scan enable input 19 determines whether the scan circuit 10 operates in a normal mode or in a scan mode. In particular, the scan circuit 10 operates in the normal mode while the scan enable input 19 remains in a logic low state, and operates in a scan mode when the scan enable input 19 is in a logic high state. Each mode of operation will be briefly described.

In the normal mode, the scan enable input 19 is maintained in a logic low state, and causes the multiplexer 27 to select the normal data input 18 to be gated to its output 36. Each time there is a leading edge of a clock pulse on the clock input 22, the flip-flop 28 is loaded with the logic state present at the normal data input 18 to the multiplexer 27, and then maintains this logic state at its output 23 until the occurrence of the next leading edge of a clock pulse. Since the scan enable input 19 is maintained in the logic low state, the NAND gate 29 will be disabled, and will be maintaining a logic high state at the scan data output 24 of the scan circuit 10.

The scan mode is in effect when the scan enable input 19 is maintained in a logic high state. In the scan mode, the logic high state at the scan enable input 19 causes the multiplexer 27 to select the scan data input 17 to be gated to its output 36. Thus, each time there is a leading edge of a clock pulse at clock input 22, the flip-flop 28 is loaded with the logic state which is present at the scan data input 17. The flip-flop 28 then maintains this logic state at the normal data output 23 of the scan circuit 10, until the next leading edge of a clock pulse. The inverted data output QZ of the flip-flop 28 is applied at 27 to an input of the NAND gate 29. Since the scan enable input 19 is in a logic high state, the NAND gate 29 will be enabled, and will supply to the scan data output 24 of the scan circuit a signal which is the inverse of the logic state present at the inverted data output QZ of the flip-flop. The gate 29 will, of course, add some propagation delay to the signal passing through it from the inverted data output QZ of the flip-flop 28, so that the scan data output 24 always switches slightly later than the normal data output 23. Aside from this, when the scan enable input 19 remains in a logic high state during the scan mode, the logic state present at the scan data output 24 will be the same logic state which is present at the normal data output 23.

As discussed above, the scan circuit 10 of FIG. 1 is designed so that the scan data output 24 switches slightly later than the normal data output 23, because this is desirable in most applications. However, it is within the scope of the present invention to alternatively design the circuitry of the flip-flop 28 and/or gate 29 so that the scan data output 24 normally switches at about the same time as, or slightly earlier than, the normal data output output 23.

Figure 2:
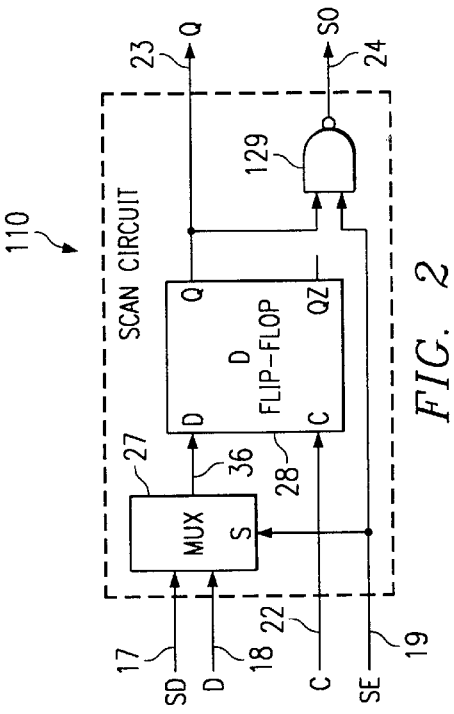
FIG. 2 is a schematic diagram of a scan circuit which embodies the present invention, and which is an alternative embodiment of the scan circuit of FIG. 1.

FIG. 2 is a schematic diagram of a scan circuit 110 which embodies the present invention, and which is an alternative embodiment of the scan circuit 10 of FIG. 1. The scan circuit 110 of FIG. 2 is identical to the scan circuit 10 of FIG. 1, except that the NAND gate 29 of FIG. 1 has been replaced with a two-input AND gate 129. The AND gate 129 has its two inputs respectively coupled to the normal data output 23 and the scan enable input 19. During the normal mode, the scan enable input 19 will have a logic low state and will cause the AND gate 129 to maintain the scan data output 24 at a logic low state. This is a difference from the operation of the scan circuit 10, which maintains the scan data output 24 in a logic high state during the normal mode. Aside from this difference, the scan circuit 10 of FIG. 1 and the scan circuit 110 of FIG. 2 are functionally identical.

Figure 3:
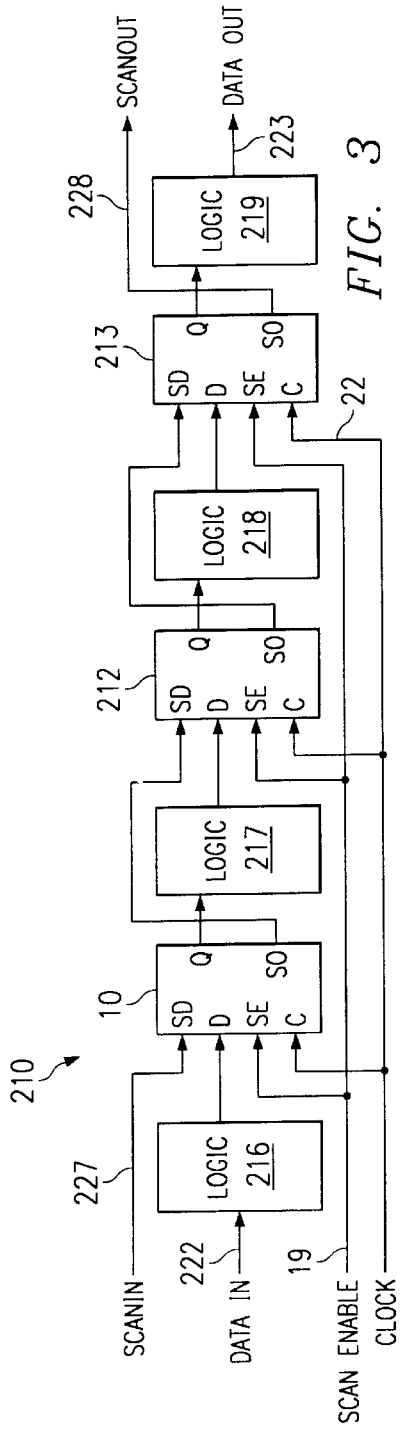
FIG. 3 is a schematic diagram of a system circuit, which includes a plurality of scan circuits of the type shown in FIG. 1.

FIG. 3 is a schematic diagram of a system circuit 210 which, in the disclosed embodiment, is implemented within an integrated circuit. The system circuit 210 includes the scan circuit 10 of FIG. 1, and also includes two further scan circuits 212 and 213, which are each identical to the scan circuit 10. The system circuit 210 further includes combinational logic circuits 216–219. The combinational logic circuits 216–219 have inputs which are respectively coupled to an operational data input 222 of the system circuit 210, the normal data output Q of the scan circuit 10, the normal data output Q of the scan circuit 212, and the normal data output Q of the scan circuit 213. The combinational logic circuits 216–218 also have outputs which are respectively coupled to the normal data input D of the scan circuit 10, the normal data input D of the scan circuit 212, the normal data input D of the scan circuit 213, and an operational data output 223 from the system circuit 210.

The scan enable inputs SE of the scan circuits 10 and 212–213 are all coupled to the same scan enable signal 19. The clock inputs C of the scan circuits 10 and 212–213 are all connected to the same clock signal 22. The scan circuits 10 and 212–213 have scan data inputs SD which are respectively coupled to a scan data input signal 227 for the system circuit 210, the scan data output S0 of the scan circuit 10, and the scan data output S0 of the scan circuit 212. The scan data output S0 of the scan circuit 213 serves as a scan data output signal 228 from the system circuit 210.

The operation of the system circuit 210 will now be briefly described. When the scan enable signal 19 is in a logic low state, the scan enable circuit 210 operates in the normal mode. In the normal mode, input data provided at 222 to the system circuit 210 progresses on successive clock pulses through the combinational logic 216 to the scan circuit 10, then through the combinational logic 217 to the scan circuit 212, then through the combinational logic 218 to the scan circuit 213, and then through the combinational logic 219 to the operational data output 223.

The normal mode of the system circuit 210 may be temporarily interrupted by placing the circuit 210 in the scan mode. In the scan mode, it will be noted that the scan circuits 10 and 212–213 are connected directly in series, without any intervening combinational logic. Thus, data present in the flip-flop in each of the scan circuits 10 and 212–213 can be accessed by serially shifting the data from all of these flip-flops through the scan circuits and out the scan output 228. Alteratively, the flip-flop in each of the scan circuits 10 and 212–213 can be set to a respective selected logic state by supplying the selected logic states for all of the flip-flops serially to the scan input 227 while clocking the data serially through the chain of scan circuits.

Thus, there are two different reasons for interrupting the normal mode in order to temporarily place the system circuit 210 in the scan mode. One such reason is to read out the data which has come to be present in the flip-flops of the scan circuits as a result of normal operation. The other such reason is to introduce predetermined data into the flip-flops in the scan circuits, in order to resume the normal mode of operation with each of these flip-flops set to a preselected condition. The scan mode is thus useful for both debug and test purposes.

In the system circuit 210, the scan data connection between respective scan circuits may be relatively long in comparison to the lengths of normal operational connections between other elements of the circuit. In a CMOS implementation of the system circuit 10, the length of these runs causes each run to effectively appear as a capacitance which must be switched as the scan output S0 of a scan circuit changes logic states. In a CMOS circuit, switching this capacitance represents power consumption.

According to a feature of the present invention, each of the scan circuits 10 and 212–213 has a gate which disables its scan data output S0 in the scan mode. For example, this is effected in the scan circuit 10 by the NAND gate 29, and is effected in the scan circuit 110 by the AND gate 129. In a CMOS device, the gates 29 and 129 can each be implemented with two to four transistors. When the scan enable input 19 is in a logic low state and disables the gate, the transistors which implement the gate will not be switching, and thus will use minimal power. In fact, although providing the gate in a scan circuit requires the provision of additional transistors, and thus the additional power consumption required for those transistors, when the additional transistors are disabled from switching in the normal mode, their minimal power consumption will be less than the power consumption which would result from switching the capacitance of a typical scan connection run.

The present invention provides a number of technical advantages. One such technical advantage is that the use of scan circuits embodying the present invention will significantly reduce the overall power consumption of an integrated circuit, in comparison to the use of known scan circuits in the same integrated circuit. A further advantage is that the scan circuit according to the present invention operates with standard tester control signals and does not require any new control signals, as a result of which it is entirely compatible with the timing and control logic of existing testers. Still another advantage is that the invention involves the addition of only a single gate which, in a CMOS implementation, can be realized with only two to four additional transistors. Implementation of these additional transistors requires minimal additional area in an integrated circuit.

Although two embodiments have been illustrated and described in detail, it should be understood that various changes, substitutions and alterations can be made therein without departing from the scope of the present invention. For example, although the disclosed embodiments each use a D-type flip-flop, it will be recognized that other types of flip-flops could alternatively be utilized. In addition, although each disclosed embodiment utilizes either an AND gate or a NAND gate, it will be recognized that there are other types of gate circuits which could alternatively be utilized to realize the present invention. It should also be recognized that direct connections disclosed herein could be altered, such that two disclosed components or elements are coupled to one another through an intermediate device or devices without being directly connected, while still realizing the present invention. Other changes, substitutions and alterations, including the reversal and rearrangement of parts, are also possible without departing from the spirit and scope of the present invention, as defined by the following claims.

What is claimed is:

1. A scan circuit comprising:
   normal data input;
   a scan data input;

a scan enable input;

a normal data output;

a scan data output;

a clock input;

a multiplexer having a first input coupled to said normal data input, a second input coupled to said scan data input, an output, and a control input coupled to said scan enable input, said multiplexer coupling said first input to said output when said control input has a first logic state and connecting said second input to said output when said control input has a second logic state different from the first logic state;

an operational circuit including a flip-flop having a clock input coupled to said clock input of said scan circuit, a data input coupled to said output of said multiplexer, a data output coupled to said normal data output of said scan circuit and an inverted data output having an opposite digital state than said normal data output; and a NAND gate having a first input coupled to said inverting data output of said flip flop, a second input coupled to said scan enable input, and an output coupled to said scan data output.

2. An apparatus comprising:

first and second scan circuits, each including:

a normal data input, a scan data input, a scan enable input, a normal data output, a scan data output, a clock input, a multiplexer having a first input coupled to said normal data input, a second input coupled to said scan data input, an output, and a control input coupled to said scan enable input, said multiplexer coupling said first input to said output when said control input has a first logic state and connecting said second input to said output when said control input has a second logic state different from the first logic state, an operational circuit including a flip-flop having a clock input coupled to said clock input of said scan circuit, a data input coupled to said output of said multiplexer, a data output coupled to said normal data output of said scan circuit and an inverted data output having an opposite digital state than said normal data output, and a NAND gate having a first input coupled to said inverting data output of said flip flop, a second input coupled to said scan enable input, and an output coupled to said scan data output, and said scan data output of said first scan circuit connected to said scan data input of said second scan circuit.

* * * * *